US009991150B2

(12) United States Patent
Tang

(10) Patent No.: US 9,991,150 B2
(45) Date of Patent: Jun. 5, 2018

(54) PROCEDURE OF PROCESSING A WORKPIECE AND AN APPARATUS DESIGNED FOR THE PROCEDURE

(71) Applicant: Micro Materials Inc., Camarillo, CA (US)

(72) Inventor: Hao Tang, Chino Hills, CA (US)

(73) Assignee: Micro Materials Inc., Camarillo, CA (US)

(*) Notice: Subject to any disclaimer, the term of this patent is extended or adjusted under 35 U.S.C. 154(b) by 36 days.

(21) Appl. No.: 15/278,141

(22) Filed: Sep. 28, 2016

(65) Prior Publication Data

US 2017/0018450 A1    Jan. 19, 2017

Related U.S. Application Data

(63) Continuation-in-part of application No. 14/797,122, filed on Jul. 11, 2015, and a continuation-in-part of application No. 14/797,124, filed on Jul. 11, 2015.
(Continued)

(30) Foreign Application Priority Data

Dec. 12, 2014    (CN) .......................... 2014 1 0766550

(51) Int. Cl.
*B32B 38/10*        (2006.01)
*H01L 21/683*       (2006.01)
(Continued)

(52) U.S. Cl.
CPC .......... *H01L 21/6835* (2013.01); *B05D 1/005* (2013.01); *B05D 1/32* (2013.01);
(Continued)

(58) Field of Classification Search
CPC .. B32B 38/10; B32B 43/006; Y10T 156/1111; Y10T 156/1116;
(Continued)

(56) References Cited

U.S. PATENT DOCUMENTS 8,443,863 B2    5/2013 Nishimoto et al.
8,470,129 B1    6/2013 Wang
(Continued)

OTHER PUBLICATIONS

C. Landesberger, S. Scherbaum, K, Bock, Carrier techniques for thin wafer processing, CS Mantech Conference, May 14-17, 2007, pp. 33-36, Austin, Texas, USA.

*Primary Examiner* — Mark A Osele
*Assistant Examiner* — Nickolas Harm
(74) *Attorney, Agent, or Firm* — Guosheng Wang; United States Research and Patent Firm

(57) ABSTRACT

The present invention provides a procedure of processing a workpiece such as backside grinding of a device wafer and an apparatus designed for the procedure. The procedure comprises (1) preparing a bonded stack comprising (e.g. consisting of) a carrier layer, a workpiece layer, and an interposer layer therebetween; (2) processing the workpiece layer; and (3) delivering a gas jet at the junction between two adjacent layers in the stack to separate or debond the two adjacent layers. Technical merits of the invention include enhanced efficiency, higher wafer throughput, reduced stress on workpiece surface, and uniformly distributed stress and avoidance of device wafer breakage and internal device damage, among others.

18 Claims, 8 Drawing Sheets

Related U.S. Application Data

(60) Provisional application No. 62/245,239, filed on Oct. 22, 2015.

(51) Int. Cl.

| | | |
|---|---|---|
| *B05D 1/00* | (2006.01) | |
| *B05D 1/32* | (2006.01) | |
| *C23C 14/22* | (2006.01) | |
| *B24B 37/20* | (2012.01) | |
| *C25D 7/12* | (2006.01) | |
| *C25D 17/06* | (2006.01) | |
| *H01L 21/67* | (2006.01) | |
| *B32B 43/00* | (2006.01) | |
| *B32B 37/06* | (2006.01) | |
| *B32B 37/12* | (2006.01) | |

(52) U.S. Cl.
CPC .............. *B24B 37/20* (2013.01); *C23C 14/22* (2013.01); *C25D 7/12* (2013.01); *C25D 17/06* (2013.01); *H01L 21/67092* (2013.01); *B32B 37/06* (2013.01); *B32B 37/12* (2013.01); *B32B 38/10* (2013.01); *B32B 43/006* (2013.01); *B32B 2307/20* (2013.01); *B32B 2457/14* (2013.01); *H01L 21/6836* (2013.01); *H01L 2221/6834* (2013.01); *H01L 2221/68318* (2013.01); *H01L 2221/68327* (2013.01); *H01L 2221/68381* (2013.01); *Y10T 156/1111* (2015.01); *Y10T 156/1116* (2015.01); *Y10T 156/1137* (2015.01); *Y10T 156/1153* (2015.01); *Y10T 156/1158* (2015.01); *Y10T 156/1184* (2015.01); *Y10T 156/1911* (2015.01); *Y10T 156/1917* (2015.01); *Y10T 156/1939* (2015.01); *Y10T 156/1967* (2015.01)

(58) Field of Classification Search
CPC ......... Y10T 156/1137; Y10T 156/1153; Y10T 156/1158; Y10T 156/1184; Y10T 156/1911; Y10T 156/1917; Y10T 156/1939; Y10T 156/1967
USPC ....... 156/703, 704, 708, 711, 712, 717, 752, 156/753, 757, 762, 930, 941
See application file for complete search history.

(56) References Cited

U.S. PATENT DOCUMENTS

| | | | |
|---|---|---|---|
| 2002/0129899 A1* | 9/2002 | Mimata | H01L 21/67132 156/707 |
| 2002/0157794 A1 | 10/2002 | Yanagita et al. | |
| 2003/0010445 A1* | 1/2003 | Yanagita | H01L 21/67092 156/708 |
| 2003/0047280 A1 | 3/2003 | Takayama et al. | |
| 2004/0226916 A1* | 11/2004 | Kobayashi | H01L 21/6708 216/83 |
| 2007/0054436 A1 | 3/2007 | Hirakata et al. | |
| 2008/0041523 A1* | 2/2008 | Kamei | G03F 7/168 156/703 |
| 2010/0038035 A1 | 2/2010 | Noda et al. | |
| 2010/0243159 A1 | 9/2010 | Nishio et al. | |
| 2013/0084459 A1 | 4/2013 | Larson et al. | |
| 2013/0206331 A1 | 8/2013 | Ho et al. | |
| 2013/0292062 A1 | 11/2013 | Iwashita et al. | |
| 2014/0020847 A1 | 1/2014 | Burggraf et al. | |
| 2014/0178701 A1 | 6/2014 | Dukkipati et al. | |
| 2014/0239453 A1 | 8/2014 | Puligadda et al. | |

* cited by examiner

PROCEDURE OF PROCESSING A WORKPIECE AND AN APPARATUS DESIGNED FOR THE PROCEDURE

CROSS-REFERENCE TO RELATED U.S. APPLICATIONS

This application claims benefit of U.S. Provisional Application No. 62/245,239, filed on Oct. 22, 2015, entitled "Carrier-Workpiece Stack Comprising a Single Interposer Layer and Methods Thereof", the entire disclosure of which is incorporated herein by reference. This application is a CIP application from application Ser. No. 14/797,124 filed Jul. 11, 2015, entitled "Method of Separating a Carrier-Workpiece Bonded Stack", which claims the benefit of priority under the Paris Convention based on Chinese Application No. 201510247398.3 filed on May 14, 2015, the entire disclosures of which are incorporated herein by reference. This application is a CIP application from application Ser. No. 14/797,122 filed Jul. 11, 2015, entitled "SUPPORT FOR BONDING A WORKPIECE AND METHOD THEREOF", which claims the benefit of priority under 35 U.S.C. 119(a) and the Paris Convention based on Chinese Application No. 201410766550.4 and International Patent Application No. PCT/CN2014093716, both of which were filed on Dec. 12, 2014, and the entire disclosures of which are incorporated herein by reference.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

FIELD OF THE INVENTION

The present invention generally relates to a procedure of processing a workpiece such as a device wafer and a debonding apparatus for implementing the procedure. The invention is particularly useful for processing a workpiece made of any brittle material, such as semiconductor wafers e.g. silicon and gallium arsenide, a rock crystal wafer, sapphire and glass; and for making thin products such as optical lens, thin silicon wafer, thin LCD glass, thin rock crystal wafer, thin metal plate, thin crystal disk, and thin solid membrane, film or filter, among others. For example, the invention may be used to separate a device wafer after wafer thinning and other backside processing.

BACKGROUND OF THE INVENTION

Silicon wafers used in high-volume integrated circuit production are typically 200 or 300 mm in diameter and have a through-wafer thickness of about 750 microns. Without thinning, it would be nearly impossible to form backside electrical contacts that connect with front-side circuitry by passing the connections through the wafer.

Highly efficient thinning processes for semiconductor-grade silicon and compound semiconductors based on mechanical grinding (back-grinding) and polishing as well as chemical etching are now in commercial use. Nevertheless, a problem still exists on how to support the wafers during back-grinding and TSV-formation processes, because these steps impose high thermal and mechanical stresses on the device wafer as it is being thinned or after thinning.

For example, a bonded stack may be formed by mounting the full-thickness device wafer face down to a rigid carrier with a polymeric adhesive. It is then thinned and processed from the backside. The fully processed, ultra-thin wafer is then removed or debonded from the carrier after the backside processing has been completed. In debonding the bonded stack, particularly in an automatic process, complicated mechanical mechanisms such as robot arms must be employed to manipulate the stack using strong but non-uniform mechanical force, to execute motions like sliding, lifting, and twisting. As thinned wafers are extremely fragile, defects associated with this approach include device wafer breakage and damage within the microscopic circuitry of individual devices, which lead to device failure and yield loss. Moreover, complicated mechanical mechanisms also suffer from the disadvantages of higher cost, difficult operation, and lower efficiency.

Therefore, there exists a need for new approaches for debonding a carrier-workpiece bonded stack that can enhance the efficiency, simplify the procedure, provide high wafer throughput, reduce stress on workpiece surface, and uniformly distribute stress and therefore reduce or eliminate the risks for device wafer breakage and internal device damage. Advantageously, the present invention provides a solution that can meet such a need.

SUMMARY OF THE INVENTION

One aspect of the present invention provides a procedure of processing a workpiece. The procedure comprises (1) preparing a bonded stack comprising (e.g. consisting of) a carrier layer, a workpiece layer, and an interposer layer therebetween; (2) processing the workpiece layer; and (3) delivering a gas jet at the junction between two adjacent layers in the stack to separate or debond said two adjacent layers.

Another aspect of the invention provides a debonding apparatus for implementing the aforementioned procedure. The apparatus includes (i) a platform that can hold the workpiece layer of the bonded stack, (ii) a mechanism that can hold the carrier layer of the bonded stack, and (iii) a gas jet delivery system for delivering a gas jet at the junction between two adjacent layers in the bonded stack.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

Step (1) of the Procedure

"Preparing a Bonded Stack Consisting of a Carrier Layer, a Workpiece Layer, and an Interposer Layer therebetween"

Figure 1:
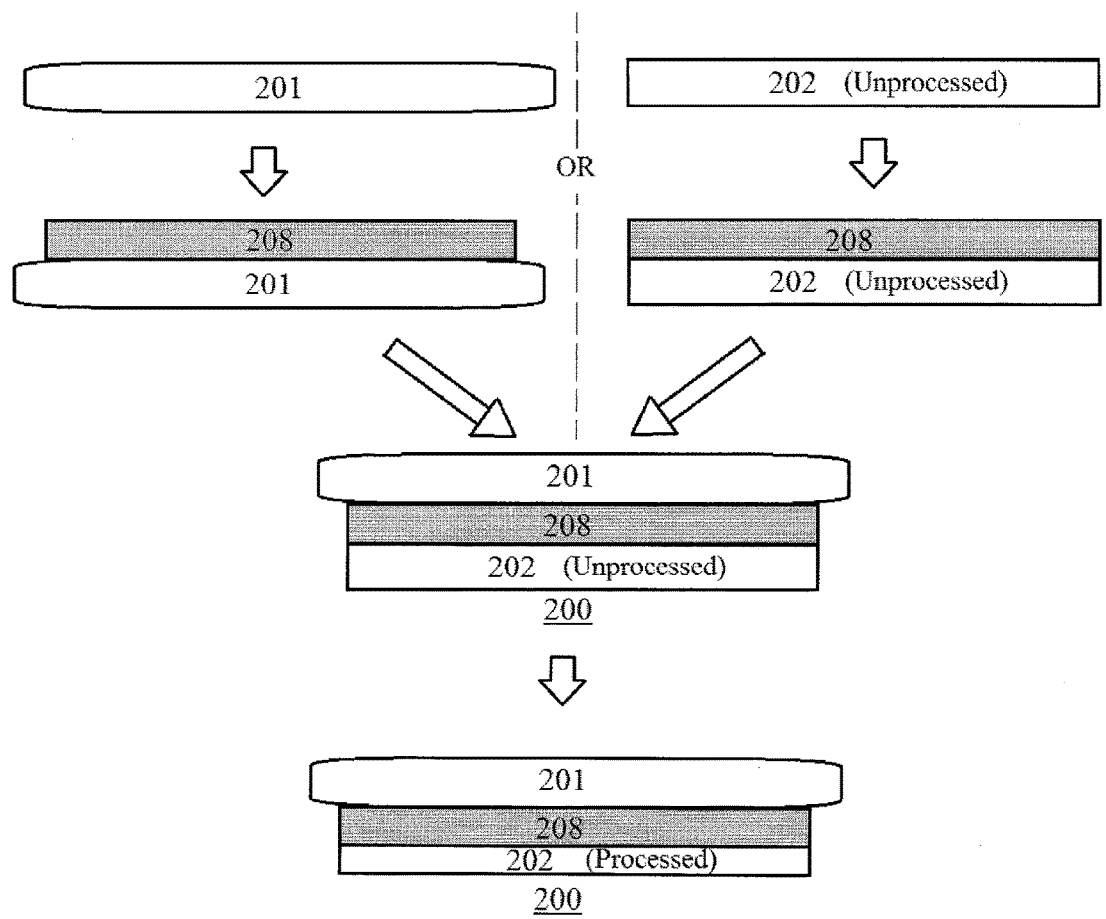
FIG. 1 shows a bonded stack comprising three layers in accordance with an exemplary embodiment of the present invention.

In an embodiment as shown in FIGS. 1-4, a bonded stack 200 is prepared, processed and separated. Referring to FIG. 1, an interposer layer 208 is bonded onto a carrier layer 201 first, and then a workpiece layer 202 is bonded onto interposer layer 208. Alternatively, interposer layer 208 may be bonded onto workpiece layer 202 first, and then carrier layer 201 is bonded onto interposer layer 208.

In a variety of embodiments according to the invention, carrier layer 201 may be made of a material such as glass, silicon, ceramics, sapphire, quartz, polysilicon, silicon dioxide, silicon-germanium, silicon (oxy)nitride, Gallium Nitride (GaN), gallium arsenide (GaAs), gallium phosphide (GaP), gallium arsenide phosphide (GaAsP), silicon carbide (SiC), metals such as stainless steel, copper, aluminum, gold, tungsten, tantalum; low k dielectrics, polymer dielectrics, and metal nitrides and silicides. In some embodiments, the surface of the carrier layer that is facing interposer layer 208 (hereinafter "bonding surface") may be pretreated, such as chemically pretreated, to lower the peeling adhesion between the two layers, before it is used to prepare bonded stack 200, so as to facilitate the future debonding by gas jetting. For example, temporary wafer bonding release material for mechanical debonding applications such as BrewerBOND 510 from Brewer Sciences, MO 65401 may be used to treat the carrier layer 201 before it is bonded to interposer layer 208 such as an adhesive layer.

In various embodiments according to the invention, the side of workpiece layer 202 facing the interposer layer 208 comprises microdevices fabricated on or from semiconducting materials such as silicon, polysilicon, silicon dioxide, silicon-germanium, silicon (oxy)nitride, Gallium Nitride (GaN), gallium arsenide (GaAs), gallium phosphide (GaP), gallium arsenide phosphide (GaAsP), silicon carbide (SiC), metals such as copper, aluminum, gold, tungsten, tantalum; low k dielectrics, polymer dielectrics, and various metal nitrides and silicides, and wherein the microdevices are selected from integrated circuits, microelectromechanical systems (MEMS), microsensors, power semiconductors, light-emitting diodes, photonic circuits, interposers, embedded passive devices, solder bumps, metal posts, and metal pillars.

In preferred embodiments, interposer layer 208 has a shear strength that is high enough to withstand the pressure, force and stress encountered in later processing steps, for example, grinding and polishing in thinning a wafer. Shear strength can be tested by a Shear load tester. It is also desirable for layer 208 to leave a nonconductive ash when it oxidizes or burns to prevent any potential problems of electrical connections with any portion of the device wafer 202 and the individual integrated circuit dice on it. Preferably, interposer layer 208 can simultaneously satisfy requirements such as grinding force resistance, heat resistance during the anisotropic dry etching needed to form TSVs, chemical resistance during plating and etching, and smooth debonding of the laminated stack at or near room temperature.

Take device wafer as a representative example of the workpiece layer 202. Bonding the interposer layer 208 onto workpiece layer 202 is preferably conducted under a partial vacuum condition that is sufficient to prevent the formation of void or bubble between the interposer layer and the workpiece layer. The partial vacuum may have a pressure of lower than 1000 Pa, e.g. lower than 50 Pa to lower than 1 Pa. Interposer layer 208 may have a thickness in the range of 1 µm to 150 µm. Examples of interposer layer 208 include, but are not limited to, Z-Bond 510 and Z-Bond 520 from Micro Materials Inc., Camarillo, Calif. 93012; BrewerBond 220 from Brewer Sciences, MO 65401; BrewerBond 305 from Brewer Sciences, MO 65401; and PVC film such as Grafix Cling Film from Grafix Plastics, OH 44137.

The preparation of bonded stack 200 can be carried out using known methods and apparatuses. For example, Z-BT200 Bonder is commercially available from Micro Materials Inc. (Camarillo, Calif., USA), and can be used for temporary or permanent wafer bonding. The platform of Z-BT200 is a 150 and 200 mm single chamber semi-auto wafer bonder with SiC bonding plates. Up to 10 kN bonding force with a less than ±5% force uniformity is preferably used in the fabrication of stack 200. In preferred embodiments, a wafer bonder's specification includes maximum temperature of 400° C., maximum vacuum of 0.00001 Pascal, less than 5 minutes vacuum speed to 0.00001 Pascal (e.g. using oil free roughing pump plus turbo molecular pump for high vacuum), less than 20 seconds of gas backfill time, less than 50 µm of in chamber auto alignment, and up to 6 WPH throughput with one stack and one chamber design.

In an exemplary embodiment, interposer layer 208, workpiece layer 202 and carrier layer 201 are Z-Bond 510, a device water, and a glass disk or plate, respectively. Z-Bond 510 is a spin-on dry film adhesive for wafer temporary bonding application. Z-Bond 510 resists most processing chemicals and is thermally stable up to 400° C. The adhesive has a viscosity of ~1000 cps, and a thermal stability at up to 450 C in N2. With Z-BT200 Bonder, step (1) in the Summary of the Invention may include the following sub-steps: (1) Coating spin: coating Z-Bond 510 at 500 rpm 30 seconds on the carrier, the hard baking to dry film; (2) Loading: the carrier is placed underneath the device wafer, but the two are separated, and are not in contact to each other yet; (3) Soaking: while the carrier and the device wafer are separated, heat both plates or layers to 200 C for 5 minutes, and vacuum is down to 0.01 Pa; (4) Bonding: Bring the carrier and the device wafer together, ramp up the temperature to 300 C, apply 600 kg force for 8-inch wafer, or 200 kg force for 6-inch wafer; (5) Cooling down: Keep the same bonding force and backfill the chamber, cooling plates down to 200 C; and (6) Finishing: Unload the bonded stack.

Step (2) of the Procedure

"Processing the Workpiece Layer"

Next, workpiece layer 202 is processed. It should be appreciated that processing the workpiece can broadly include grinding, polishing, photoresist spin coating, photolithograph, electrical plating, physical vapor deposition, metal redistribution layer formation, TSV-formation, chemical-mechanical polishing, etching, metal and dielectric deposition, patterning, passivation, annealing, transferring, and any combination thereof. Taking grinding as an example, grinding the workpiece may be carried out for the preparation of a thin product such as optical lens, thin wafer, thin LCD glass, thin rock crystal wafer, thin metal plate, thin crystal disk, and thin solid membrane, film or filter.

Take grinding the backside a device wafer as a representative example of the "processing". In processing the workpiece, interposer layer 208 preferably has a shear strength of at least 1 MPa, and does not flow at a temperature in the range of from about 150° C. to about 400° C. In the thinning step, layer 201 such as a carrier wafer may be held in place with tooling that utilizes a vacuum chuck or some means of mechanical attachment. Mechanical thinning is performed by bringing layer 202 such as the backside of a device wafer into contact with a hard and flat rotating horizontal platter that contains a liquid slurry. The slurry may contain abrasive media along with chemical etchants such as ammonia, fluoride, or combinations thereof. The abrasive provides "gross" substrate removal, i.e., thinning, while the etchant chemistry facilitates "polishing" at the submicron level. The device wafer is maintained in contact with the media until an amount of the wafer material has been removed to achieve a targeted thickness. After a device wafer is thinned, it may optionally be bonded onto a cutting film (or dicing film), prior to separating the carrier layer and the interposer layer from each other.

After thinning, through-wafer electrical connections, commonly referred to as through-silicon-vias or "TSVs", can be formed on thinned wafer. It should be appreciated that TSV-formation processes including steps such as chemical-mechanical polishing (CMP), lithography, etching, deposition, annealing, and cleaning can also be carried out on the surface. For example, via holes can be etched on the surface to facilitate frontside contacts. In order to construct a via on the wafer with a thicknesses of less than 100 µm using common dry-etch techniques, the via only needs to have a diameter of 30-70 µm. Therefore, for backside processing, thin wafers can be processed more quickly and at lower cost.

Step (3) of the Procedure

"Delivering a Gas Jet at the Junction Between Two Adjacent Layers in the Stack to Separate or Debond Said Two Adjacent Layers"

Figure 2:
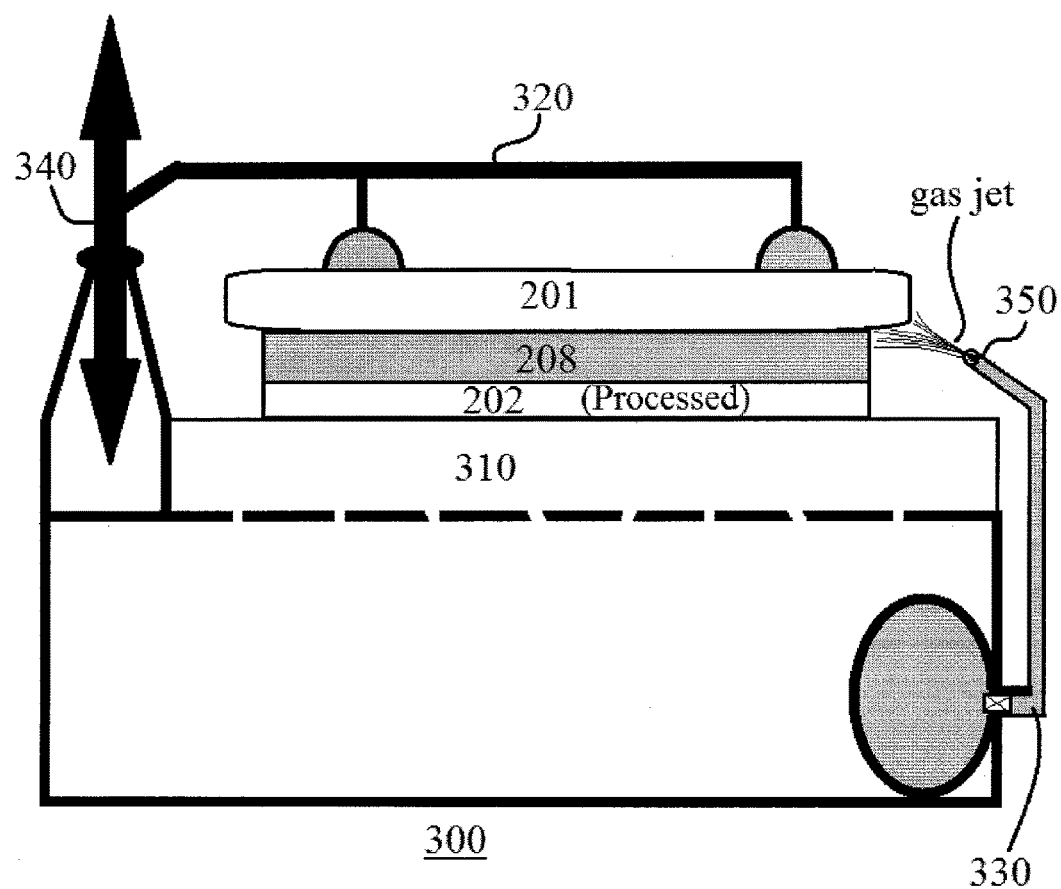
FIG. 2 schematically illustrates a debonding apparatus used to debond two adjacent layers in the stack of FIG. 1 in accordance with an exemplary embodiment of the present invention.

In stack 200, while interposer layer 208 and carrier layer 201 are the so-called "two adjacent layers", and interposer layer 208 and workpiece layer 202 are too. FIG. 2 schematically illustrates a debonding apparatus 300 that is used to separate or debond two adjacent layers in stack 200, for example, interposer layer 208 and carrier layer 201. Apparatus 300 comprises (i) a platform 310 that can hold the workpiece layer 202 of the bonded stack 200; (ii) a mechanism 320 that can hold the carrier layer 201; and (iii) a gas jet delivery system 330 for delivering a gas jet at the junction between the two adjacent layers. The gas can be selected from air, nitrogen, helium, argon, or any mixture thereof, and the gas jet can be generated by releasing a gas stream in a pipe through a nozzle 350. The pressure of the gas stream may be in the range of 2-10 Bar, and the flow rate of the gas stream may be in the range of 10-1000 liters/minute.

Figure 3:
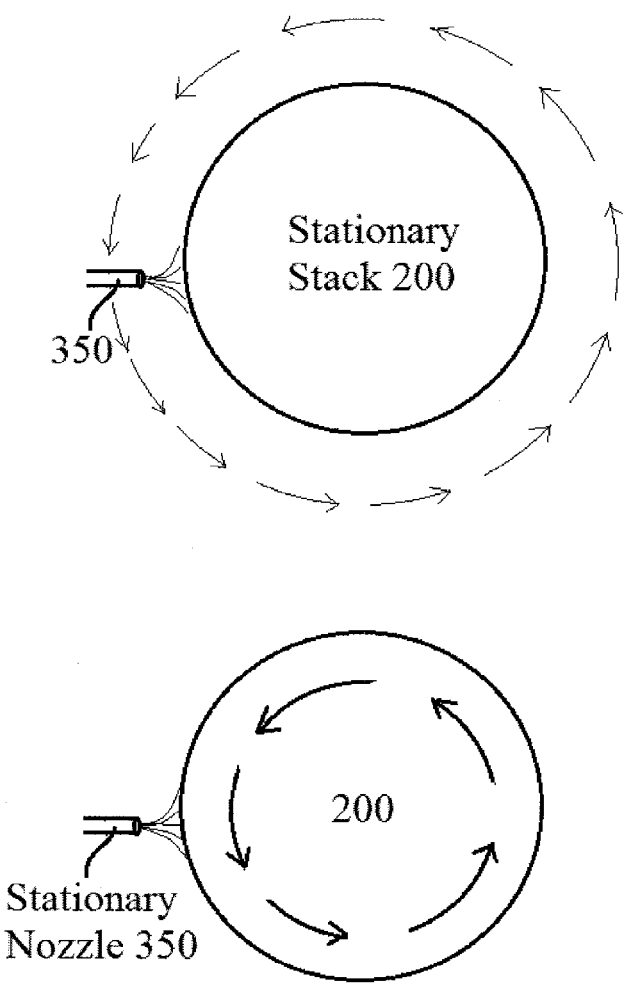
FIG. 3 demonstrates the relative movement between a nozzle and a bonded stack in the apparatus of FIG. 2 in accordance with an exemplary embodiment of the present invention.

In "delivering a gas jet", 1 to 6 stationary nozzles 350 can be placed around stationary stack 200, blowing gas jets to the junction. In other embodiments as shown in FIG. 3, apparatus 300 can rotate the nozzle(s) around a stationary stack 200; alternatively, it can spin the stack 200 relative to stationary nozzle(s). The gas jet creates an impact force on the junction first to tear open the two adjacent layers. Later, the two layers are incompletely separated, and gas jet continues to create an impact force on the unbounded or exposed surfaces of layers 201 and 208, until the two layers are completely separated. After the separation, carrier layer 201 may float over interposer layer 208 with the help from the "pushing up" force from the gas jet.

Figure 4:
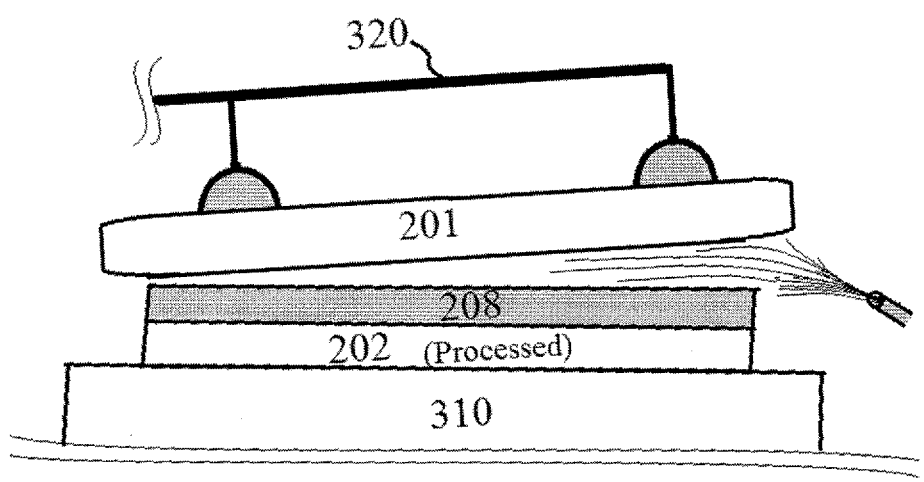
FIG. 4 illustrates a gas jet that blows at the junction between two adjacent layers in the stack of FIG. 1 in accordance with an exemplary embodiment of the present invention.

In various embodiments, apparatus 300 may include a separator 340 that can apply a force to move the platform 310 and the mechanism 320 away from each other, and thus move carrier layer 201 and workpiece layer 202 away from each other. In some embodiments, the force from the separator 340 participates and/or facilitates the separation of the two adjacent layers. Referring to FIG. 4, the gas jet from system 330 is delivered to, or blows at, the junction between two adjacent layers, for example, interposer layer 208 and carrier layer 201, and the two layers are separated or debonded.

Take device wafer and Z-D200A DeBonder as representative examples of the workpiece layer 202 and apparatus 300 respectively. Z-D200A DeBonder may be commercially available from Micro Materials Inc. (Camarillo, Calif., USA). Z-D200A DeBonder can be used for air jetting debonding, and wafer debonding from its carrier can be accomplished in less than one minute at room temperature, without solvent treatment. Platform 310 as embodied in Z-D200A DeBonder is a wafer vacuum chuck. Workpiece layer 202 (processed) such as a thinned wafer may be further protected with a dicing tape (not shown) between the thinned wafer and the wafer vacuum chuck. In preferred embodiments, the wafer debonder's specification includes a platform of 150 and 200 mm semi-auto wafer debonder, room temperature debonding, greater than 0.7 MPa of compressed air pressure (part of gas jet delivery system 330), auto interface recognition (adjacent junction recognition) with controlled air aiming and jetting, auto unloader for unloading debonded carrier into a cassette, up to 100 UPH of debonding throughput, and optional wafer mount/tape laminator.

In a typical embodiment, the debonding sequence using Z-D200A DeBonder may be that (1) bonded stack 200 (e.g. with processed layer 202) is loaded on a stage with carrier layer 201 on top; (2) keep carrier layer and workpiece layer such as device wafer flat with vacuum holding, a tape is optionally laminated on device wafer for extra protection; (3) the carrier layer is separated from interposer layer 208 by gas or air jetting as described above; and (4) carrier layer 201 such as carrier wafer or glass is transferred to a carrier magazine. These embodiments of the present invention are particularly useful in providing thin wafer handling solutions for 3D vertical integration of MEMS, IC, memory and CMOS image sensor, and also providing 350° C. temporary bonding solution, coupled with thin wafer debonding by low stress air jetting. With apparatus 300 such as Z-D200A DeBonder, the procedure of the present invention requires no physical contact with thin wafer and bonding adhesive (an example of interposer layer 208) during the entire debonding process, maximizing protection to valuable wafers.

Figure 5:
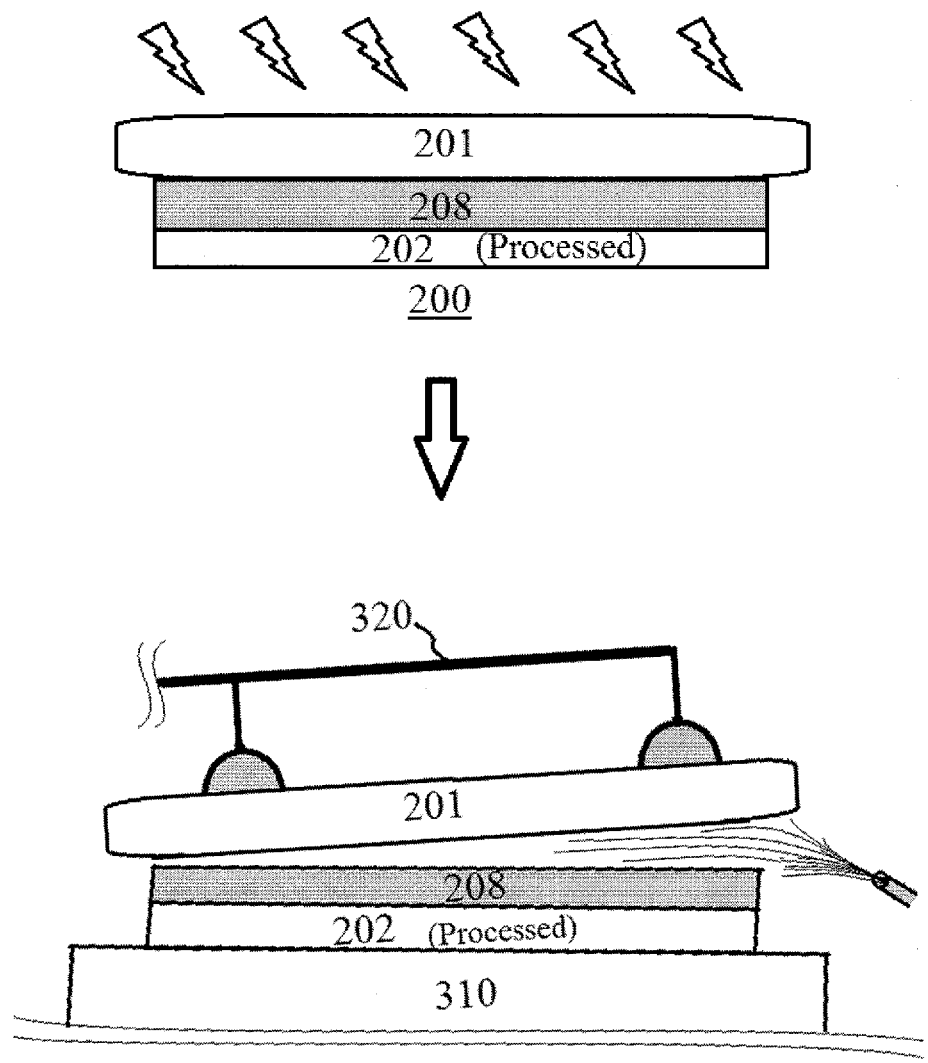
FIG. 5 illustrates an interposer layer that is subject to a treatment for lowering its peeling strength in accordance with an exemplary embodiment of the present invention.

Some optional sub-steps may be added either before the gas jetting, or after the gas jetting. For example, an additional step may be carried out in some embodiments to reduce the peeling strength between the two adjacent layers that are to be separated or debonded, before the gas jetting. As shown in FIG. 5, the interposer layer 208 may be treated with, for example, active energy ray irradiation, UV light irradiation, electron beam irradiation, visible light irradiation, laser irradiation, infrared irradiation, thermal treatment, electrical field treatment, magnetic field treatment, electromagnetic wave treatment, ultrasonic treatment, or any combination thereof. Preferably, the post-treatment peeling strength is reduced to a range of from 0.01 to 50.0 g/cm, preferably from 0.01 to 10.0 g/cm, and more preferably from 0.01 to 5.0 g/cm, as determined by ASTM D6862. In a specific embodiment, interposer layer 208 is made of UV curable adhesive, and, when the layer 208 is cured with UV light, the chemical properties of layer 208 is altered. As a result, the peeling strength of the UV cured adhesive is reduced to a lower range, as required by later gas jetting such as air jetting debonding process.

Figure 6:
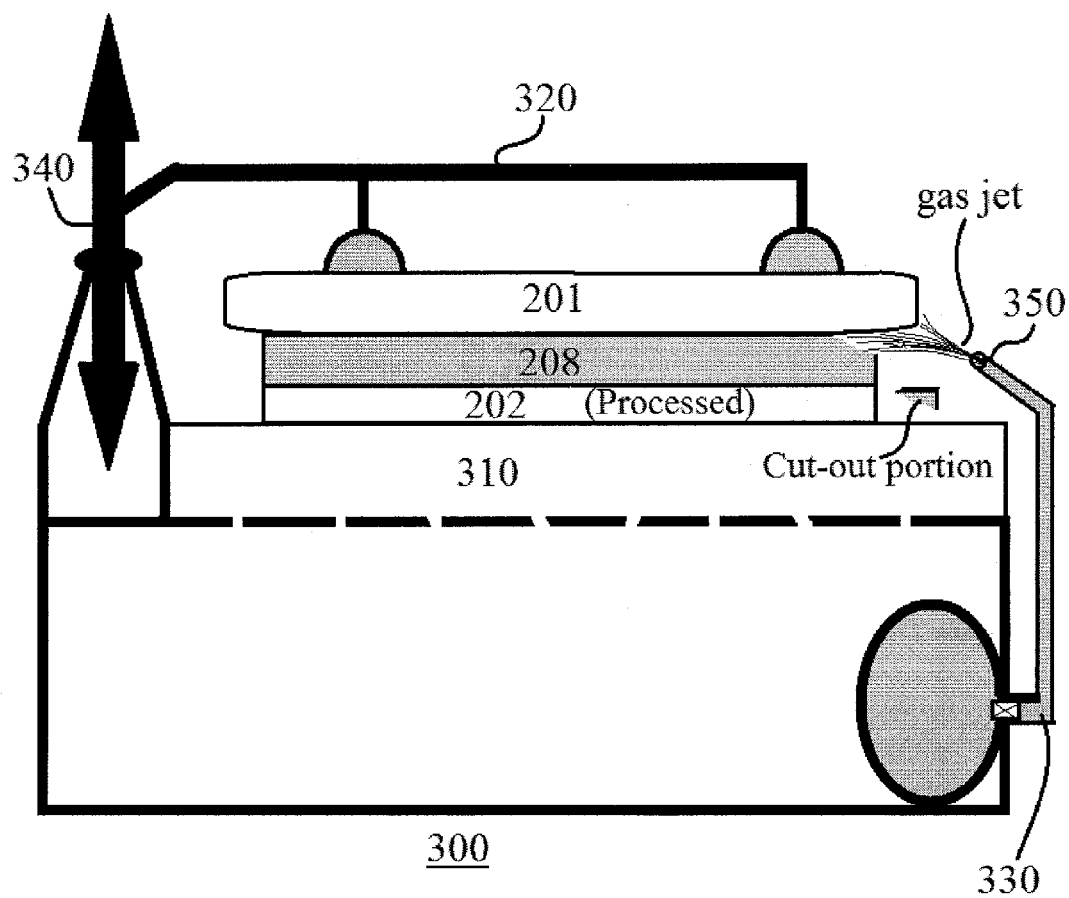
FIG. 6 shows that a portion of the junction between two adjacent layers is cut out to facilitate the entry of gas jet into the interface of the layers in accordance with an exemplary embodiment of the present invention.

In exemplary embodiments, the procedure includes an additional step of mechanically and/or chemically disrupting or destroying a portion of an outer periphery of the junction, before delivering the gas jet thereto. For example, an operator can use a sharp tool such as knife to cut away, or use a solvent to dissolve away, a portion of the outer periphery at the junction of two adjacent layers. As shown in FIG. 6, a blade (not shown) can be used to cut a portion of an outer periphery of the junction or one of the adjacent layers (e.g. a small portion of interposer layer 208), before delivering the gas jet thereto. The space that was occupied by the cut-out portion can receive more gas jet, and thus facilitate the debonding between the two layers.

Figure 7:
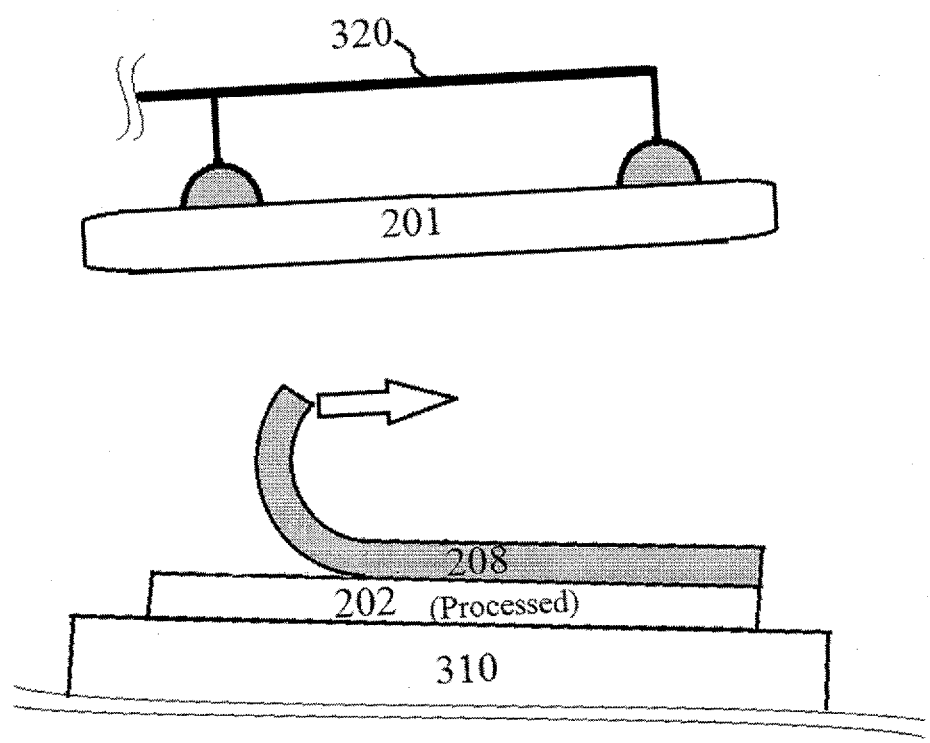
FIG. 7 schematically illustrates that the interposer layer in its entirety is peeled off from the workpiece layer in accordance with an exemplary embodiment of the present invention.

The procedure of the present invention may further comprise an additional step of separating the two layers that remain bonded to each other in stack 200, after the gas jetting. As shown in FIG. 7, after interposer layer 208 and carrier layer 201 are separated, interposer layer 208 and workpiece layer 202 remain bonded to each other. Layers 208 and 202 may be debonded using any known methods. In preferred embodiments, layer 208 in its entirety can be removed (e.g. physically peeled off) from workpiece layer 202, therefore layer 208 apparently functions as a single interposer in the process, despite that layer 208 may be fabricated or laminated using multiple sublayers of different chemical natures. In removing layer 208 from workpiece layer 202, platform 310 may or may not keep holding workpiece layer 202. For example, Z-Bond 510 film can be easily peeled off from Si and glass surface, while platform 310 keeps holding the device wafer.

EXAMPLES

In a first example of the invention as illustrated in FIGS. 1 and 4, the procedure includes (1) spin coating a liquid adhesive on the carrier 201, and cure the adhesive to a dry film (layer 208); (2) bonding workpiece layer 202 such as wafer/substrate/glass by force/vacuum at a temperature above the melting point of the film; and (3) debonding carrier 201 from the dry film with air jetting, for example, after workpiece 202 has been processed.

In a second example of the invention as illustrated in FIGS. 1 and 4, the procedure includes (1) laminating a dry double side cling film (as layer 208) on carrier 201; (2) laminating workpiece layer 202 such as wafer/substrate/glass on double side cling film with heat/force/vacuum; and (3) debonding carrier 201 from the double side cling film with air jetting, for example, after workpiece 202 has been processed.

In a third example of the invention as illustrated in FIGS. 1, 4 and 5, the carrier layer 201 is a transparent glass, and the procedure includes (1) spin coating a UV liquid PSA adhesive (layer 208) on the carrier 201, and the PSA adhesive remains wet and is not dried; (2) bonding workpiece layer 202 such as wafer/substrate/glass on PSA adhesive (layer 208) with force/vacuum, and processing the workpiece; (3) irradiating UV light through the transparent carrier 201 to the UV adhesive (layer 208) to cure the adhesive, the adhesion of the adhesive layer 208 to the carrier 201 and workpiece layer 202 is sufficiently lowered; and (4) debonding carrier 201 from the cured adhesive layer 208 with air jetting.

In a fourth example of the invention as illustrated in FIGS. 1, 4, 5 and 7, the carrier layer 201 is a transparent glass, and the procedure includes (1) laminating a double side UV tape (as layer 208) on carrier 201; (2) laminating workpiece layer 202 such as wafer/substrate/glass on double side UV tape with heat/force/vacuum, and processing the workpiece; (3) irradiating UV light through the transparent carrier 201 to the double side UV tape (layer 208) to cure both sides thereof, the adhesion of the double side UV tape to the carrier 201 and workpiece layer 202 is sufficiently lowered; (4) debonding carrier 201 from the cured double side UV tape with air jetting; and (5) peeling off the cured double side UV tape from workpiece layer 202, as shown in FIG. 7.

In a fifth example of the invention as illustrated in FIGS. 1 and 4, the procedure includes (1) preparing carrier layer

201 by spin coating BrewerBOND 510 from Brewer Sciences (not shown) on the bonding surface of a bare glass/silicon disk or wafer, and then hot plate baking the bonding surface at 205° C. for 60 seconds; (2) coating a liquid adhesive BrewerBOND 220 from Brewer Sciences on the bonding surface of workpiece layer 202 such as wafer/substrate/glass, and curing the liquid adhesive to a dry film (layer 208); (3) bonding workpiece layer 202 and carrier layer 201 by force/vacuum at 130° C.; and (4) debonding carrier layer 201 from the dry film with air jetting, for example, after workpiece 202 has been processed.

In a sixth example of the invention as illustrated in FIGS. 1 and 4, the procedure includes (1) preparing carrier layer 201 by spin coating BrewerBOND 510 from Brewer Sciences (not shown) on the bonding surface of a bare glass/silicon disk or wafer, and then hot plate baking the bonding surface at 205° C. for 60 seconds; (2) coating a liquid adhesive Z-BOND 601 from Micro Material Inc. (Camarillo, Calif.) on the bonding surface of workpiece layer 202 such as wafer/substrate/glass; (3) bonding workpiece layer 202 and carrier layer 201 by force/vacuum at 150° C., and in the meanwhile, curing the liquid adhesive to a dry film (layer 208); and (4) debonding carrier layer 201 from the dry film with air jetting, for example, after workpiece 202 has been processed.

Figure 8:
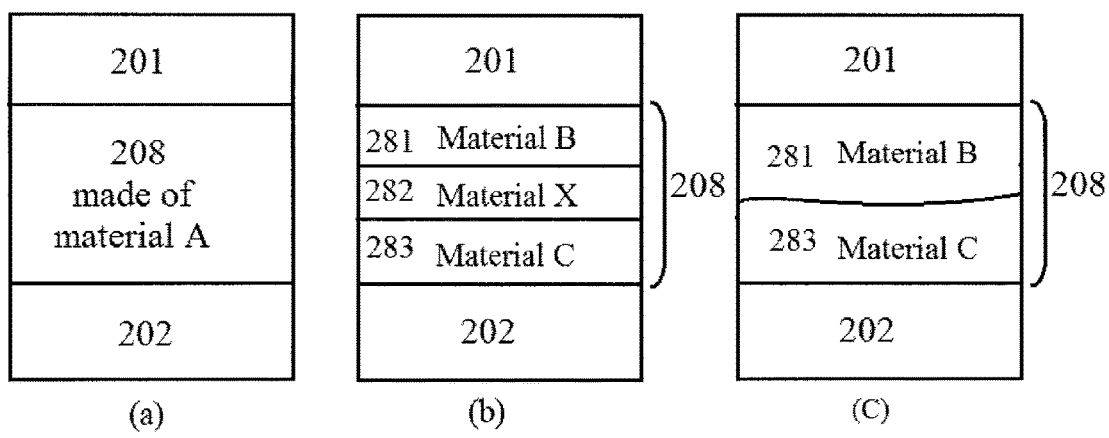
FIG. 8 shows various structures of the interposer lay in accordance with an exemplary embodiment of the present invention.

The temporary bonding structure of stack 200 as shown in FIG. 8 can be generally applied for thin device handling, thin/flexible substrate manufacturing, thin semiconductor wafer fabrication, integrated circuit vertical stacking, thin device quality control inspection, thin device transportation and temporary device protection from mechanical vibration/shock, etc. Examples of workpiece layer 202 include semiconductor IC wafer, thin substrate, glass wafer, glass pieces to be thinned, a substrate to be thinned, and other object needs to be thinned.

Referring to FIG. 8, Material A in Panel (a) can be in the form of wax, glue, dry lamination film, sticky adhesive, liquid adhesive, and spin-on adhesive etc. Alternatively, interposer layer 208 may be made from 3 laminated sub-layers as shown in Panel (b), or 2 laminated sub-layers as shown in in Panel (c). In in Panel (b), the first sub-layer 281 made of Material B is bonded to carrier layer 201. The third sub-layer 283 made of Material C is bonded to workpiece layer 202. The second sub-layer 282 made of Material X is sandwiched between the first sub-layer 281 and the third sub-layer 283, and is bonded to the two. The second sub-layer 282 made of Material X is omitted in in Panel (c).

Interposer layer 208 may be produced as an independent product utilizing any one of a number of well-known extrusion (for configuration in Panel (a)) or coextrusion (for Panel (b) and (c) configurations) processes. As an independent product, interposer layer 208 may be sandwiched between two release films which is easy to peel off immediately before layer 208 is applied to carrier layer 201 and/or workpiece layer 202.

In various embodiments, Material A may be a resin material with suitable cling property for bonding to both layers 201 and 202. In an example, Material A having cling property comprises a polymer of two or more monomers, wherein a first monomer comprises ethylene and a second monomer comprises an acrylate, said polymer comprising an acrylate content of 2% to 40% by weight based upon the weight of said polymer. Such polymer shall generally be referred to as an ethylene-acrylate (or EA) polymer.

Material A, Material B, and Material C can be independently of each other selected from pressure-sensitive adhesive (PSA), non-PSA, UV curable adhesive, or combination thereof. For example, crosslinking of PSA (preferably lowering the peel strength to carrier) can be done with active energy ray curing, electron beam curing (EBC) and UV/Vis curing. Material B and Material C may be chemically same or different, and may have different thicknesses. Examples of pressure-sensitive adhesive include acrylic adhesive, rubber adhesive, ethylenevinyl acetate, nitriles, SBC, vinyl alkylether adhesive, silicone adhesive, polyester adhesive, polyamine adhesive, urethane adhesive, fluorine adhesive, and epoxy adhesive. These adhesives may be used alone or in combination of two or more. The adhesive may be an adhesive in any types, and, for example, emulsion-type adhesives, solvent-type (solution-type) adhesives, active energy ray-curing adhesives, heat-fusing adhesives (hot-melt adhesive) and others are favorably used.

For some interposer layer 208 containing sub-layers 281 and 283, sub-layer 282 made of Material X may be needed between them. The method of preparing such a layer is not particularly limited, and an example thereof is a method of applying (coating) Material B/C on a sub-layer made of Material X, as a base material or release liner, and drying and/or curing the product, as needed. Any known coating method can be used for the application (coating), and conventional coaters, such as gravure roll coaters, reverse roll coaters, kiss roll coaters, dip roll coaters, bar coaters, knife coaters, spray coaters, comma coaters, and direct coaters, can be used.

Material X may be selected from paper base materials such as various papers; plastic base materials such as films and sheets of various resins (e.g., olefinic resins, polyester resins, polyvinyl chloride resins, vinyl acetate resins, amide resins, polyimide resins, polyether ether ketone, polyphenylene sulfide, etc.); rubber base materials such as rubber sheets; fiber base materials such as woven and nonwoven fabrics, felts, and nets; foams such as foam sheets; metal base materials such as metal foils and metal plates; the laminated films thereof and the like. Material X may have a single- or multi-layer configuration. The surface of Material X may be, as needed for improvement in adhesiveness to sub-layers 281 and 283, subjected to any known or common surface treatment, for example to oxidation by a chemical or physical method such as chromate treatment, ozone exposure, flame exposure, high-pressure electrical shock exposure, or ionizing radiation treatment and also for example to coating treatment with an undercoating agent.

With respect to the efficiency of separating the device wafer 202 and the carrier wafer 201, the present invention is advantageous over known techniques that involve laser ablation, plasma etching, water jetting, sawing or cutting etc. to etch, decompose or cleave bonding layers, since the device wafer and the carrier wafer can be readily separated by peeling off interposer layer 208. The present invention can enhance the performance of the thin-wafer handling with lower stress in the debonding step and higher efficiency in removing boding layers, and without the sacrifice of other performances such as thermal stability, compatibility with harsh backside processing steps, protection of bumps on the front side of the wafer by encapsulation, and fewer defects on the front side.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A procedure of processing a workpiece, comprising (1) preparing a bonded stack comprising a carrier layer, a workpiece layer, and an interposer layer therebetween; (2) processing the workpiece layer; and (3) delivering a gas jet at a junction between two adjacent layers in the stack to completely separate or completely debond said two adjacent layers without using laser ablation, plasma etching, water jetting, sawing, or cutting to etch, decompose or cleave said two adjacent layers, wherein the interposer layer comprises a resin material, an ethylene-acrylate polymer, acrylic adhesive, rubber adhesive, ethylenevinyl acetate, nitrile, SBC, vinyl alkylether adhesive, silicone adhesive, polyester adhesive, polyamine adhesive, urethane adhesive, fluorine adhesive, epoxy adhesive, olefinic resin, polyester resin, polyvinyl chloride resin, vinyl acetate resin, amide resin, polyimide resin, polyether ether ketone, or polyphenylene sulfide.

2. The procedure according to claim 1, herein said two adjacent layers are the carrier layer and the interposer layer.

3. The procedure according to claim 1, wherein said carrier layer is made of a material selected from glass, silicon, ceramics, sapphire, quartz, polysilicon, silicon dioxide, silicon-germanium, silicon (oxy)nitride, Gallium Nitride (GaN), gallium arsenide (GaAs), gallium phosphide (GaP), gallium arsenide phosphide (GaAsP), silicon carbide (SiC), metals; low k dielectrics, polymer dielectrics, and metal nitrides and silicides.

4. The procedure according to claim 1, further comprising a step of pretreating a bonding surface of the carrier layer before the step of preparing said bonded stack.

5. The procedure according to claim 1, wherein a surface of the workpiece layer facing the interposer layer comprises microdevices fabricated on or from semiconducting materials, metals; low k dielectrics, polymer dielectrics, and metal nitrides and silicides, and wherein the microdevices are selected from integrated circuits, microelectromechanical systems (MEMS), microsensors, power semiconductors, light-emitting diodes, photonic circuits, interposers, embedded passive devices, solder bumps, metal posts, and metal pillars.

6. The procedure according to claim 1, wherein said processing the workpiece layer in step (2) comprises grinding, polishing, photoresist spin coating, photolithograph, electrical plating, physical vapor deposition, metal redistribution layer formation, TSV-formation, chemical-mechanical polishing, etching, metal and dielectric deposition, patterning, passivation, annealing, transferring, or any combination thereof.

7. The procedure according to claim 1, wherein said processing the workpiece layer in step (2) comprises grinding said workpiece to make a thin product selected from optical lens, thin wafer, thin LCD glass, thin rock crystal wafer, thin metal plate, thin crystal disk, and thin solid membrane, film or filter.

8. The procedure according to claim 1, wherein the gas is selected from air, nitrogen, helium, argon, or any mixture thereof.

9. The procedure according to claim 1, wherein the gas jet is generated by releasing a gas stream in a pipe through a nozzle.

10. The procedure according to claim 9, wherein the gas stream has a pressure in the range of 2-10 Bar.

11. The procedure according to claim 9, wherein said "delivering a gas jet" is carried out using 1 to 6 nozzles surrounding said junction.

12. The procedure according to claim 11, wherein said "delivering a gas jet" is carried out by rotating the nozzle(s) around the stack which is stationary, or by spinning the stack relative to stationary nozzle(s).

13. The procedure according to claim 1, further comprising a step before step (3) and after step (2), which is reducing the peeling strength between said two adjacent layers.

14. The procedure according to claim 13, wherein said reducing the peeling strength is accomplished using active energy ray irradiation, UV light irradiation, electron beam irradiation, visible light irradiation, infrared irradiation, thermal treatment, electrical field treatment, magnetic field treatment, electromagnetic wave treatment, ultrasonic treatment, or any combination thereof.

15. The procedure according to claim 14, wherein said peeling strength is reduced to a range of from 0.01 to 50.0 g/cm, as determined by ASTM D6862.

16. The procedure according to claim 1, further comprising a step of mechanically and/or chemically disrupting or destroying a portion of an outer periphery of the junction, before delivering the gas jet thereto.

17. The procedure according to claim 1, further comprising a step of using a blade to cut a portion of an outer periphery of the junction, before delivering the gas jet thereto.

18. The procedure according to claim 1, further comprising a step of separating two layers that remain bonded to each other after step (3).

* * * * *